United States Patent [19]

Stefano et al.

[11] Patent Number: 4,971,655

[45] Date of Patent: Nov. 20, 1990

[54] PROTECTION OF A REFRACTORY METAL SILICIDE DURING HIGH-TEMPERATURE PROCESSING USING A DUAL-LAYER CAP OF SILICON DIOXIDE AND SILICON NITRIDE

[75] Inventors: James J. Stefano; Ruojia R. Lee, both of Boise, Id.

[73] Assignee: Micron Technology, Inc., Boise, Id.

[21] Appl. No.: 457,495

[22] Filed: Dec. 26, 1989

[51] Int. Cl.⁵ .................. H01L 21/306; B44C 1/22; C03C 15/00; C23F 1/02
[52] U.S. Cl. .................. 156/659.1; 156/653; 156/656; 156/657; 156/662; 427/38; 437/200; 437/238; 437/241
[58] Field of Search .................. 427/38, 39; 156/643, 156/646, 653, 656, 657, 659.1, 662; 437/40, 41, 52, 56, 57, 58, 59, 200, 201, 233, 238, 241, 247, 248; 204/192.23, 192.25

[56] References Cited

U.S. PATENT DOCUMENTS 4,668,365  5/1987  Foster et al. .................. 427/38
4,744,859  5/1988  Hu et al. .................. 437/41 X
4,869,781  9/1989  Euen et al. .................. 156/662 X Primary Examiner—William A. Powell
Attorney, Agent, or Firm—Angus C. Fox, III; Stanley N. Protigal

[57] ABSTRACT

A method for protecting a refractory metal silicide during high-temperature processing using a dual-layer cap of silicon oxide and silicon nitride. The problem of a silicon nitride protective layer detaching itself from an underlying refractory metal silicide layer during high-temperature processing, thus allowing tungsten atoms within the layer to oxidize, is solved by laying down a silicon oxide layer beneath the silicon nitride layer. The oxide layer acts as a mechanical stress relief layer between the refractory metal silicide and the silicon nitride layer, preventing the lifting of the nitride layer during high-temperature processing steps.

10 Claims, 7 Drawing Sheets

PROTECTION OF A REFRACTORY METAL SILICIDE DURING HIGH-TEMPERATURE PROCESSING USING A DUAL-LAYER CAP OF SILICON DIOXIDE AND SILICON NITRIDE

FIELD OF THE INVENTION

This invention is related to semiconductor process technology. More specifically, it is related to refractory metal silicide process technologies, such as those dealing with tungsten silicide ($WSi_x$).

BACKGROUND OF THE INVENTION

As integrated circuit devices are scaled down to finer and finer geometries, reduction of resistance within interconnect lines is essential if signal propagation delay is to be minimized so that component speeds may increase. Originally, field-effect transistors were truly metal-oxide-silicon (MOS) devices. However, the aluminum metal used for transistor gates and interconnect lines was incompatible with the high temperatures (around 1,000° C.) required to drive self-aligned source/drain implants into the silicon substrate. As a consequence, conductively-doped polycrystalline silicon (hereinafter, also "poly") soon replaced metallic aluminum as the primary gate and interconnect material. However, doped poly possesses far greater electrical resistance (around 20 ohms/square) than aluminum metal (approximately 0.030 ohms/square), and as device dimensions have been scaled down, the higher resistance of doped poly has become a performance limiting factor.

A number of techniques have been tried in attempts to reduce the sheet resistance of polycrystalline silicon. One of the more promising techniques involves the creation of a refractory metal silicide layer on top of the doped poly layer. A refractory metal is normally deemed to be a metal chosen from the group consisting of tungsten, molybdenum, cobalt and titanium. A refractory metal silicide may be created either by depositing one of the refractory metals on top of the poly layer and allowing it to react with the poly at elevated temperature or by depositing the refractory metal silicide directly on the poly layer. The sheet resistance of a poly layer, when coated with tungsten silicide for example, is reduced to only 5-7 ohms/square. Although it is conceivable to eliminate the poly layer altogether and use only the refractory metal silicide for transistor gates and interconnect lines, this is generally not advisable because transistor work function is altered.

For the sake of simplification, this document will, henceforth, discuss only the use of tungsten silicide ($WSi_x$). However, the same steps that are taken to protect a tungsten silicide layer may be used to protect a silicide layer of molybdenum, cobalt or titanium.

FIG. 1 is a cross-sectional drawing of a DRAM cell, employing conventional poly-tungsten silicide technology, undergoing fabrication during the gate and word line patterning stage. This cell uses conventional polycrystalline silicon-tungsten silicide technology. The cell is constructed on a lightly-doped p-type substrate 11. Field oxide regions 12 provide electrical isolation between individual cells within the array. A pad oxide layer 13 is grown on the surface of the entire wafer, followed by the blanket deposition of a poly layer 14 approximately 4,000 angstroms in thickness. Following the blanket deposition of a 1,000 angstrom-thick tungsten silicide layer 15, a patterning photoresist mask 16 is used to pattern future transistor gates and word lines.

Referring now to FIG. 2, which is a crosssection of the DRAM cell of FIG. 1 following a series of conventional etch steps, field-effect transistor gate 21 and word line 22 are fully formed and photoresist mask 16 has been removed.

The use of tungsten silicide-coated poly, though, is not without its problems. One of the problems is that the silicon and tungsten atoms within the tungsten silicide layer apparently react with oxygen (creating tungsten oxide and silicon oxide) during the silicide annealing step and other subsequent high-temperature fabrication steps. The same oxidation phenomena also afflicts silicides of molybdenum, cobalt, and titanium. Since tungsten oxide and silicon oxide are both excellent dielectrics, the effectiveness of the tungsten silicide layer is reduced. FIG. 3, a 35,000×photomicrograph of a conventional poly-silicide field-effect transistor gate, is representative of a "best-case" scenario using the conventional polysilicide process. The gate, comprised of a poly layer 14 and a tungsten silicide layer 15 has been oxidized, along with the underlying silicon substrate 11, forming a thin-spacer silicon oxide layer 31 that is used to self-align lightly-doped drain and source implants. A region 32 comprised of both silicon and tungsten oxide is visible in this photograph. Although it is sometimes possible to eliminate oxygen from the processing environment during high-temperature exposure, it is often impossible or impractical to do so.

Another problem is the mechanical instability of the tungsten silicide layer. During high-temperature processing, the layer may lift, thereby eliminating its reduced resistance effect on the poly layer. This is especially true where process variations result in offset etches. FIG. 4, a 20,200×photomicrograph, is a cross section of a pair of adjacent DRAM cells. The tungsten silicide on both transistor gates 41 has lifted and oxidized to form popcorn-like structures 42. FIG. 5, a 15,000×photomicrograph, is a top perspective view of a portion of a partially-fabricated DRAM array. The tungsten silicide layer on each of the three visible word lines 41 has become partially detached from the underlying poly layer 42, resulting in the fluffy structures 43 crowning each line.

As a result of the aforementioned problems encountered with tungsten silicide, attempts have been made to protect tungsten silicide layers with an oxygen-impermeable silicon nitride coating. However, this approach has not been very successful due to the differences in the expansion coefficients of the two materials. As a result of the mechanical stresses generated at the interface between the silicide and the nitride, the nitride will often peel away from the tungsten silicide layer in flakes, thus terminating the antioxidation protection and resulting in intense nitride particle contamination on the wafer.

What is needed is a process that will reduce the stresses generated between a nitride layer and an underlying tungsten silicide layer that is, in turn, deposited on an underlying poly layer, so that the nitride will remain bonded to the tungsten silicide layer.

SUMMARY OF THE INVENTION

The present invention eliminates the aforementioned detachment, lifting and flaking problem of a silicon nitride layer deposited on a tungsten silicide layer during high-temperature processing. This is accomplished by laying down a silicon oxide layer beneath the silicon nitride layer. Although the mechanism is not precisely known, the oxide layer apparently acts as a mechanical stress relief layer between the tungsten silicide and silicon nitride layers, absorbing the stresses that can lead to the lifting of the nitride layer.

PREFERRED EMBODIMENT OF THE INVENTION

Figure 6:
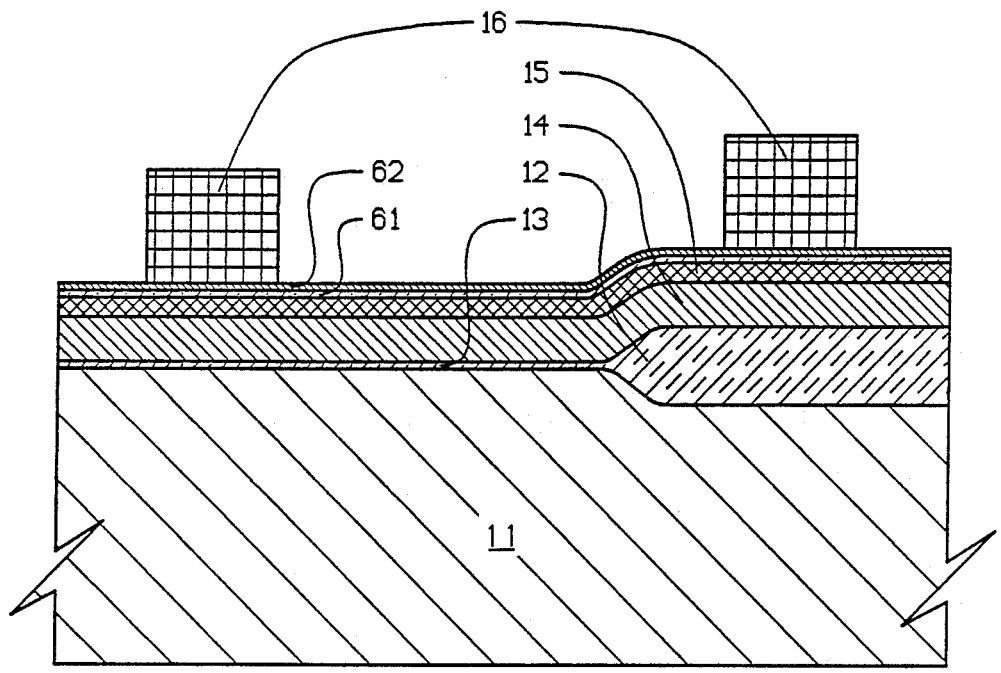
FIG. 6 is a cross-sectional drawing of a DRAM cell undergoing fabrication, in accordance with the present invention, during the gate and word line patterning stage.

Referring now to FIG. 6, a cross-sectional drawing of a DRAM cell is shown during fabrication in accordance with the present invention. At this point in the fabrication process, field oxide regions 12 have been created in a lightly-doped p-type substrate 11. A pad oxide layer 13 has been grown on the exposed surface of substrate 11. A blanket deposition of a 4,000 angstrom-thick poly layer 14 has been followed by the blanket deposition of a 1,000 angstrom-thick tungsten silicide layer 15. This was followed by the blanket plasma-enhanced chemical vapor deposition of a 100 angstrom-thick silicon oxide layer 61, which was, in turn, followed by the blanket plasma-enhanced chemical vapor deposition of a 100 angstrom-thick silicon nitride layer 62. Alternatively, low-pressure chemical vapor deposition may also be used to create silicon oxide layer 61 and silicon nitride layers 62. A poly-silicide-oxide-nitride sandwich has been created by the foregoing deposition steps. Photoresist mask 16 is used to pattern future transistor gates and word lines.

Figure 7:
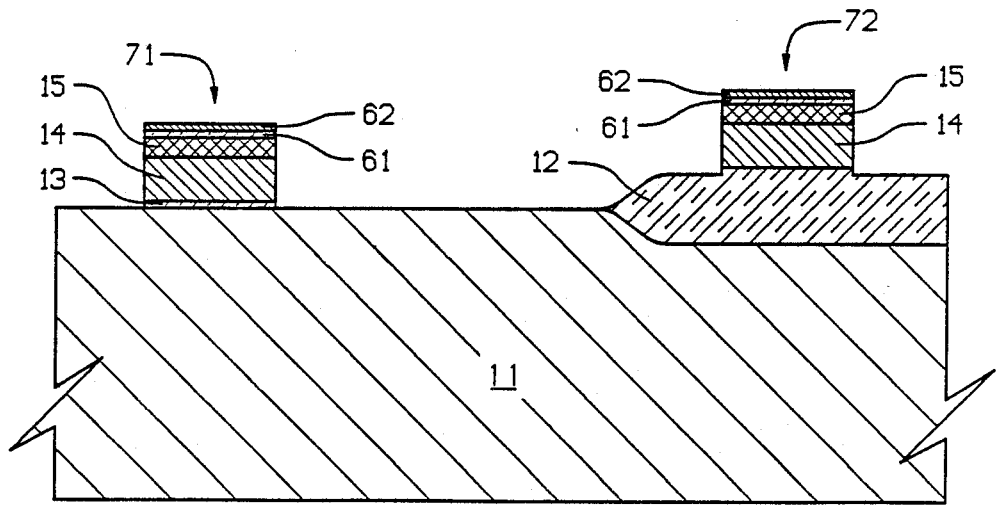
FIG. 7 is a cross-sectional drawing of the DRAM cell of FIG. 6, following an etch which creates a transistor gate and a word line.

Referring now to FIG. 7, which is a crosssectional drawing of the DRAM cell of FIG. 6 following a series of conventional etch steps, fieldeffect transistor gate 71 and word line 72 are fully formed and photoresist mask 16 has been removed.

Figure 8:
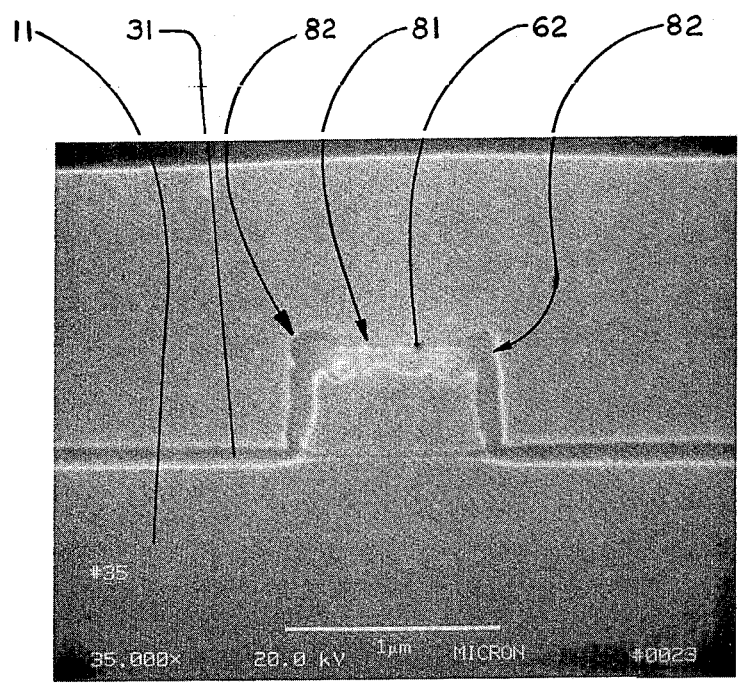
FIG. 8, a 35,000×photomicrograph, is a cross-sectional view of a transistor gate formed using layer composition in accordance with the present invention.

Referring now to FIG. 8, which is a 35,000×photomicrograph of a transistor gate 81 constructed in accordance with the present invention, it will be noted that tungsten and silicon oxide growth (from consumption of the tungsten silicide layer) is limited to only the very edges 82 of the gate. The nitride layer 62 has effectively protected the top of transistor gate 81 from oxidation. However the vertical sides of gate 81 and substrate 11 have been oxidized to form a thin-spacer siliconoxide layer 31 that is used to self align lightly-doped drain and source implants in a subsequent process step.

Figure 1:
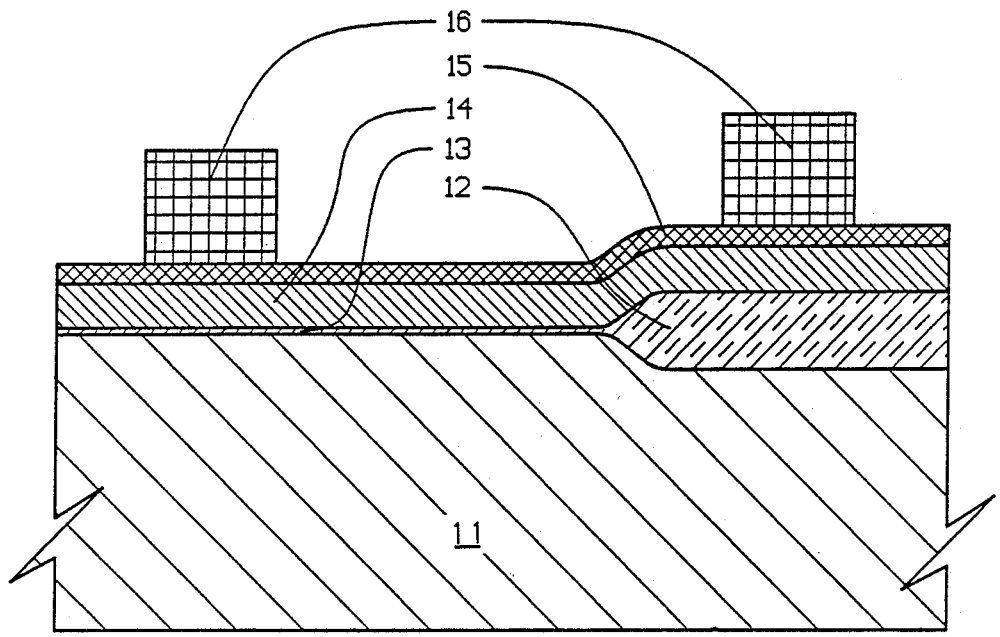
FIG. 1 is a cross-sectional drawing of a DRAM cell, employing conventional poly-tungsten silicide technology, undergoing fabrication during the gate and word line patterning stage.
Figure 2:
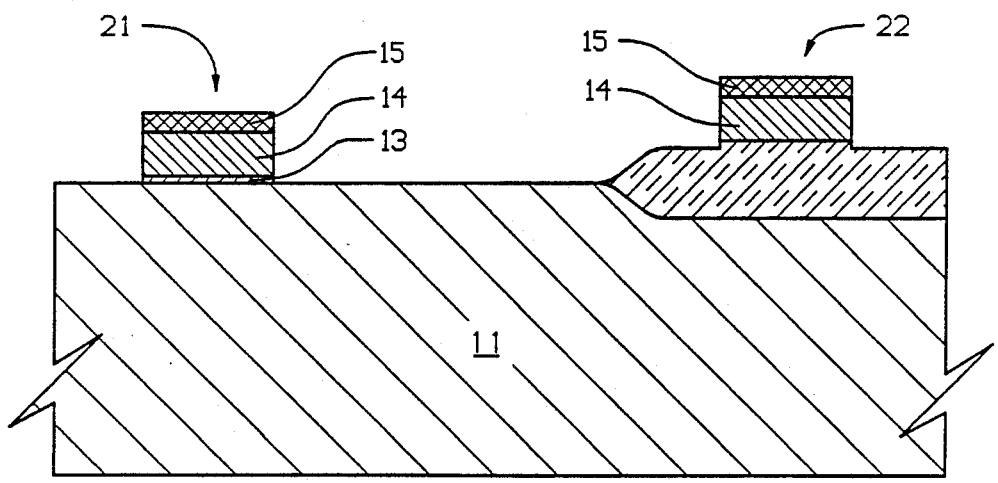
FIG. 2 is a cross-sectional drawing of the DRAM cell of FIG. 1, following an etch which creates transistor gate 21 and word line 22. Photoresist mask 16 has already been removed in this representation.
Figure 3:
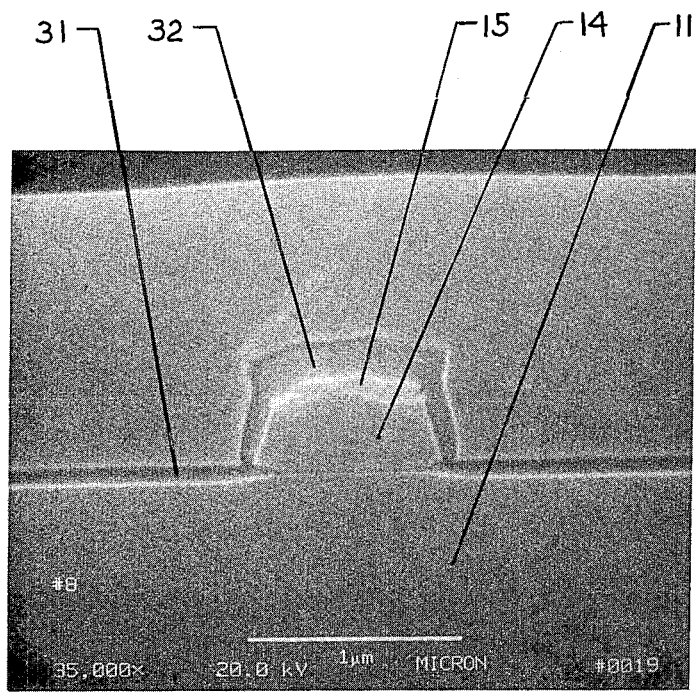
FIG. 3, a 35,000×photomicrograph, is a crosssectional view of a transistor gate formed using conventional poly-silicide technology.
Figure 4:
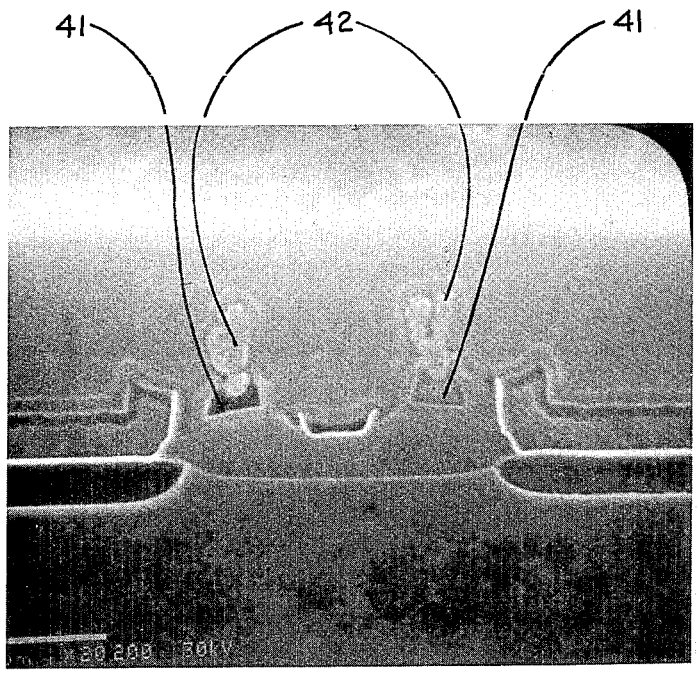
FIG. 4, a 20,200×photomicrograph, is a cross section of a pair of adjacent DRAM cells having a gate and word line layer composition similar to that of the cell depicted in FIG. 3, except that the tungsten silicide layer has lifted and oxidized during high-temperature processing.
Figure 5:
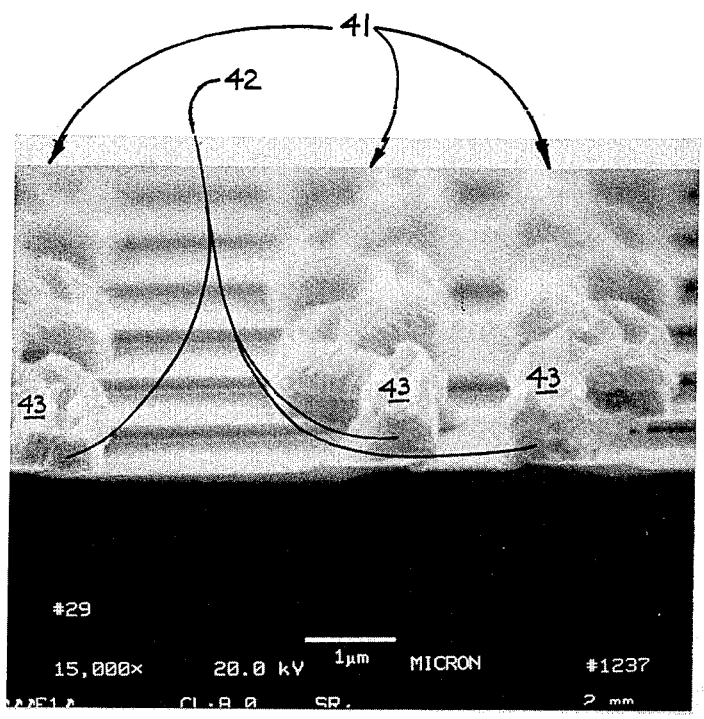
FIG. 5, a 15,000×photomicrograph, is a top perspective view of a portion of a partially-fabricated DRAM array, the cells of which have a gate and word line layer composition similar to that of the cell depicted in FIG. 3, except that the tungsten silicide layer on each of the three visible word lines has become partially detached from the underlying poly.
Figure 9:
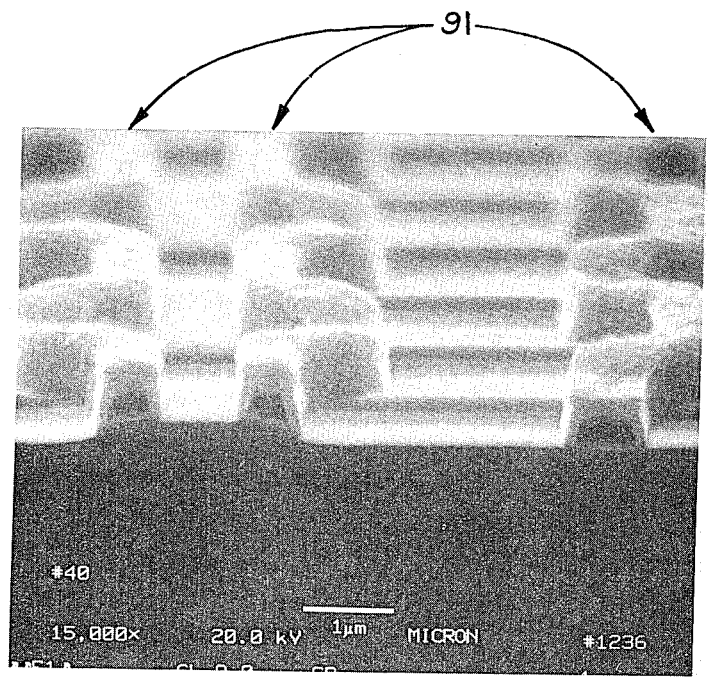
FIG. 9, a 15,000×photomicrograph, is a top perspective view of a portion of a partially-fabricated DRAM array, the cells of which have a gate and word line layer composition in accordance with the present invention.

FIG. 9, a 15,000×photomicrograph, is a top perspective view of a portion of a partially-fabricated DRAM array, the cells of which have a gate and word line layer composition in accordance with the present invention. It will be noted that all three word lines 91, in comparison to those of FIG. 5, are accurately formed and do not suffer from even minimal tungsten silicide lifting.

Although only a single embodiment of the invention has been described herein, it will be apparent to one skilled in the art that changes and modifications may be made thereto without departing from the spirit and the scope of the invention as claimed.

We claim:

1. A method for protecting a refractory metal silicide layer from oxidation during high-temperature processing comprising the following steps:
   (a) deposition of a silicon oxide layer on top of the refractory metal silicide layer; and
   (b) deposition of a silicon nitride layer on top of said silicon oxide layer.

2. The method for protecting of claim 1, wherein said silicon oxide layer is formed using a plasma-enhanced chemical vapor deposition process.

3. The method for protecting of claim 1, wherein said silicon nitride layer is formed using a plasma-enhanced chemical vapor deposition process.

4. The method for protecting of claim 1, wherein said silicon oxide layer is formed using a low-pressure chemical vapor deposition process.

5. The method for protecting of claim 1, wherein said silicon nitride layer is formed using a low-pressure chemical vapor deposition process.

6. A method of fabricating low-resistance field effect transistor gates and word lines that are stable during high-temperature processing comprising the following steps:
   (a) deposition of a polycrystalline silicon layer;
   (b) deposition of a refractory metal silicide layer on top of said polycrystalline silicon layer;
   (c) deposition of a silicon oxide layer on top of said refractory metal silicide layer;
   (d) deposition of a silicon nitride layer on top of said silicon oxide layer;
   (e) patterning said transistor gates and said word lines on the poly-silicide-oxide-nitride sandwich created by the previous four process steps with a photoresist mask; and
   (f) etching said sandwich to create said transistor gates and said word lines.

7. The method of fabricating of claim 6, wherein said silicon oxide layer is formed using a plasma-enhanced chemical vapor deposition process.

8. The method of fabricating of claim 6, wherein said silicon nitride layer is formed using a plasma-enhanced chemical vapor deposition process.

9. The method of fabricating of claim 6, wherein said silicon oxide layer is formed using a low-pressure chemical vapor deposition process.

10. The method of fabricating of claim 6, wherein said silicon nitride layer is formed using a low-pressure chemical vapor deposition process.

* * * * *